(12) United States Patent
Ooi et al.

(10) Patent No.: US 9,817,079 B2
(45) Date of Patent: Nov. 14, 2017

(54) MOLDED SENSOR PACKAGE WITH AN INTEGRATED MAGNET AND METHOD OF MANUFACTURING MOLDED SENSOR PACKAGES WITH AN INTEGRATED MAGNET

(71) Applicant: Infineon Technologies AG, Neubiberg (DE)

(72) Inventors: Choo Tian Ooi, Puchong (MY); Chew Theng Tai, Melaka (MY); Klaus Elian, Regensburg (DE); Mohd Hirzarul Hafiz Mohd Tahir, Perak (MY)

(73) Assignee: Infineon Technologies AG, Neubiberg (DE)

( * ) Notice: Subject to any disclaimer, the term of this patent is extended or adjusted under 35 U.S.C. 154(b) by 426 days.

(21) Appl. No.: 14/336,305

(22) Filed: Jul. 21, 2014

(65) Prior Publication Data

US 2016/0018476 A1 Jan. 21, 2016

(51) Int. Cl.
*H01L 21/00* (2006.01)
*G01R 33/00* (2006.01)

(52) U.S. Cl.
CPC ..... *G01R 33/0047* (2013.01); *G01R 33/0052* (2013.01); *H01L 2224/48091* (2013.01); *H01L 2924/181* (2013.01)

(58) Field of Classification Search
CPC .................................................. G01R 33/00
USPC ................... 438/39; 324/207.13, 239, 272
See application file for complete search history.

(56) References Cited

U.S. PATENT DOCUMENTS

| 2006/0255479 | A1* | 11/2006 | Kummerl | H01L 21/565 257/787 |
| 2010/0141249 | A1* | 6/2010 | Ararao | G01R 33/0047 324/244 |
| 2011/0127998 | A1* | 6/2011 | Elian | B82Y 25/00 324/219 |
| 2012/0319682 | A1* | 12/2012 | Ausserlechner | G01R 33/072 324/252 |
| 2013/0113474 | A1* | 5/2013 | Elian | G01R 33/0047 324/244 |
| 2013/0113475 | A1* | 5/2013 | Elian | G01R 33/0047 324/244 |
| 2013/0249029 | A1* | 9/2013 | Vig | G01R 33/0047 257/427 |
| 2013/0249544 | A1* | 9/2013 | Vig | G01R 33/0047 324/252 |
| 2015/0022193 | A1* | 1/2015 | Burdette | G01N 27/72 324/239 |

(Continued)

*Primary Examiner* — Caleb Henry
(74) *Attorney, Agent, or Firm* — Murphy, Bilak & Homiller, PLLC

(57) ABSTRACT

A molded sensor package includes a leadframe having a sensor die attached to the leadframe, a magnet aligned with the sensor die and a single molding compound encasing the sensor die and attaching the magnet to the leadframe. A method of manufacturing the molded sensor package includes loading the magnet and the leadframe into a molding tool so that the magnet is aligned with the sensor die in the molding tool, molding the magnet and the sensor die with the same molding compound while loaded in the molding tool and curing the molding compound so that the magnet is attached to the leadframe by the same molding compound that encases the sensor die.

11 Claims, 8 Drawing Sheets

(56) References Cited

U.S. PATENT DOCUMENTS

2015/0137796 A1* 5/2015 Ausserlechner ......... G01B 7/30
  324/207.2
2015/0355291 A1* 12/2015 Elian ...................... G01R 33/06
  324/207.2

* cited by examiner

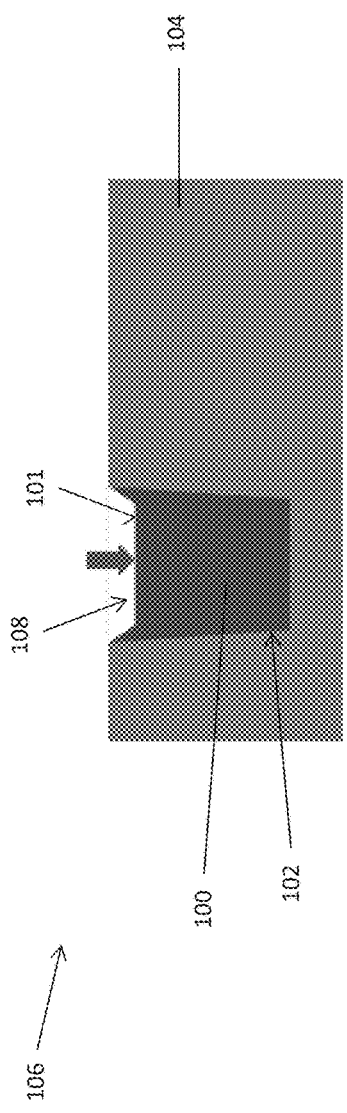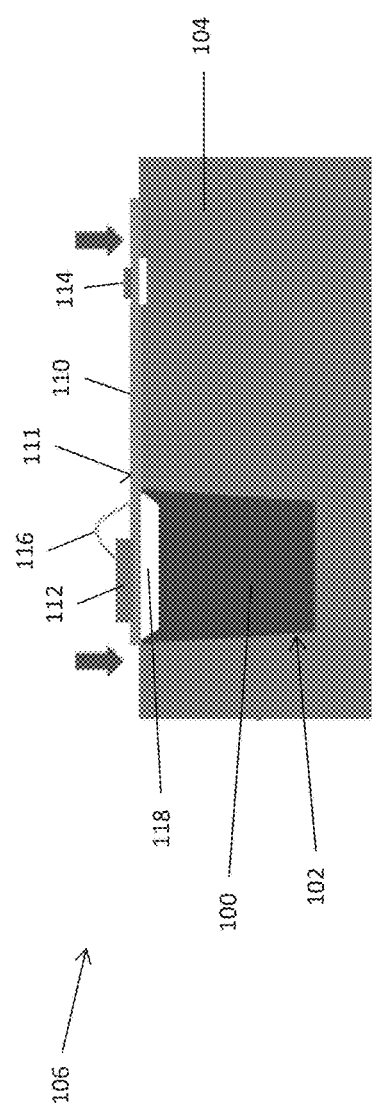

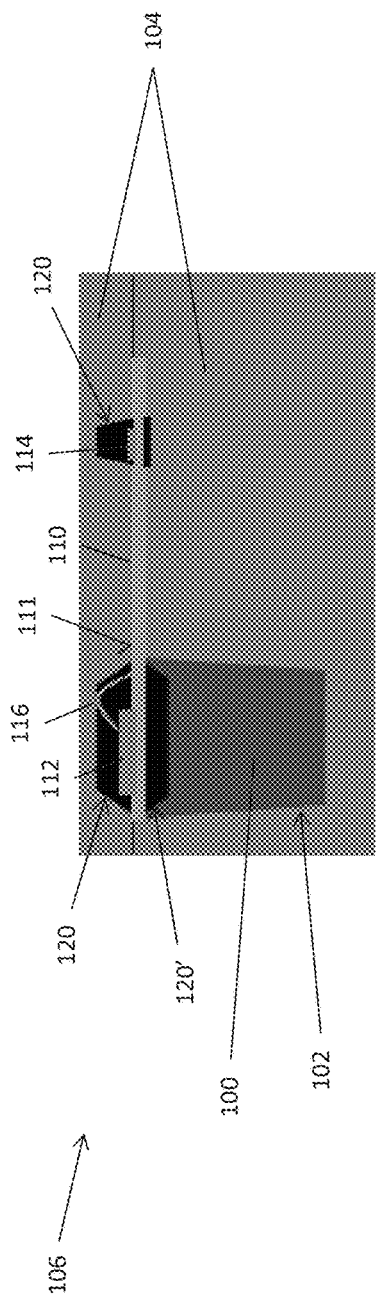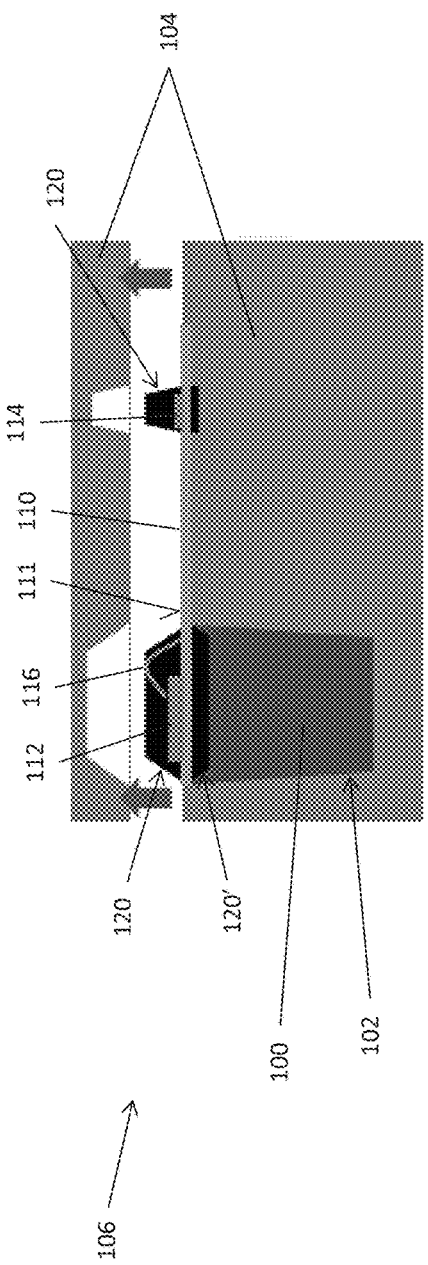
Figure 1C
Figure 1D

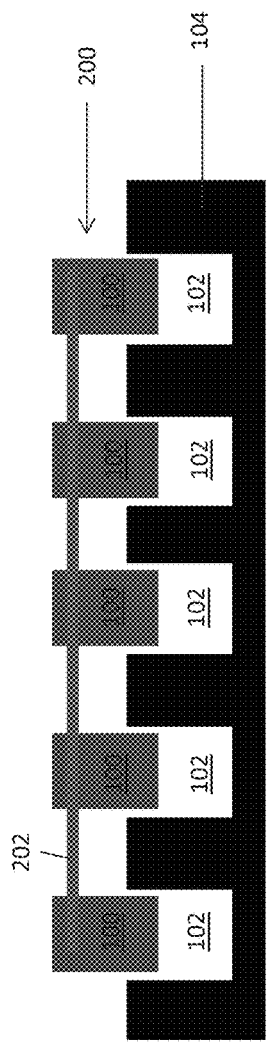
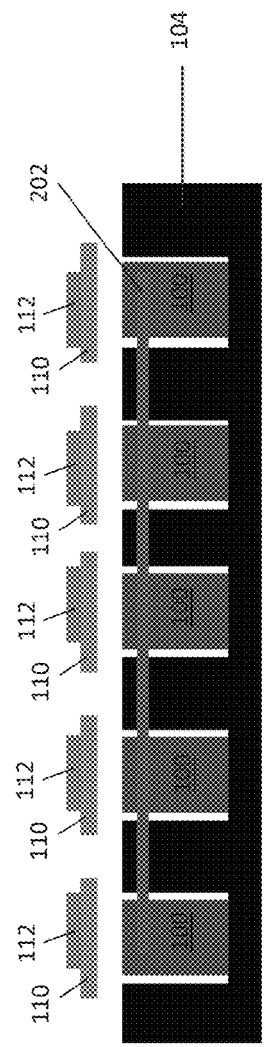
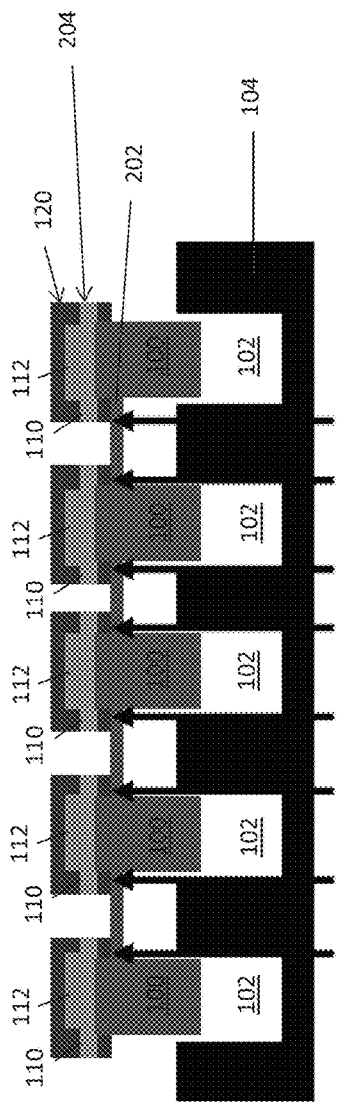
Figure 2A
Figure 2B
Figure 2C

MOLDED SENSOR PACKAGE WITH AN INTEGRATED MAGNET AND METHOD OF MANUFACTURING MOLDED SENSOR PACKAGES WITH AN INTEGRATED MAGNET

TECHNICAL FIELD

The present application relates to sensor packages, in particular molded sensor packages with magnets.

BACKGROUND

Some types of sensors such as Hall sensors and cam shaft sensors require a magnet for proper operation. These sensors are typically manufactured as a semiconductor die that is attached to a leadframe and embedded in a molding compound to form a sensor package.

In some cases, the magnet is overmolded to the sensor package. Overmolding is a technique that allows for a previously molded part to be reinserted in a mold to form a new plastic layer around the first part. Overmolding a magnet to a plastic sensor package typically involves melting pellets of magnetized material and injecting the melted material into a mold that includes the plastic package. The magnet is realized from the cured molding compound. That is, there is no physically separate magnet. Instead, the magnet is formed from the overmolded plastic itself. Overmolding requires a relatively high Tg (glass transition temperature) molding compound e.g. Tg>180° C., resulting in significant thermal stress on the sensor package. Also, molding compounds with Tg>180° C. such as multi-functional thermoplastics have a high risk of delamination when use as an overmold. Furthermore, the magnetic material must tolerate high operating temperatures (>300° C.) associated with overmolding, limiting the types of materials that can be used.

In other cases, the magnet is a separate component attached to the exterior surface of the molded sensor package e.g. by an adhesive. Such a sensor package has low electrical accuracy due to imprecise placement of the magnet, requiring the sensor die to have an otherwise large tolerance. Also, the overall package cost increases because of the production higher cost associated with serial processing a single magnet plus a pole piece. Furthermore, the magnet size and magnetic field is limited with this approach.

SUMMARY

According to an embodiment of a method of manufacturing a molded sensor package, the method comprises: loading a magnet and a leadframe having a sensor die attached to the leadframe into a molding tool so that the magnet is aligned with the sensor die in the molding tool; molding the magnet and the sensor die with the same molding compound while loaded in the molding tool; and curing the molding compound so that the magnet is attached to the leadframe by the same molding compound that encases the sensor die.

According to an embodiment of a method of manufacturing molded sensor packages, the method comprises: loading a plurality of magnets and a plurality of leadframes each having a sensor die attached to the leadframe into a molding tool so that each magnet is aligned with one of the sensor dies in the molding tool; molding the magnets and the sensor dies with the same molding compound while loaded in the molding tool; and curing the molding compound so that each magnet is attached to one of the leadframes by the same molding compound that encases the sensor die of that leadframe.

According to an embodiment of a molded sensor package, the molded sensor package comprises a leadframe having a sensor die attached to the leadframe, a magnet aligned with the sensor die and a single molding compound encasing the sensor die and attaching the magnet to the leadframe.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIG. 1, which includes FIGS. 1A through 1E, illustrates an embodiment of a method of a single molding process for manufacturing a molded sensor package with a magnet.

FIG. 2, which includes FIGS. 2A through 2C, illustrates an embodiment of a method of a single molding process for manufacturing a batch of molded sensor packages where the magnets remain interconnected during the molding process.

FIG. 3, which includes

FIG. 4, which includes

DETAILED DESCRIPTION

The embodiments described herein provide a sensor package that includes a magnet and a sensor die molded with the same molding compound, the sensor package being manufactured via a single molding process. The single molding process includes loading the magnet and a leadframe with the sensor die into a molding tool so that the magnet is aligned with the sensor die, molding the magnet and the sensor die with the same molding compound while loaded in the molding tool and curing the molding compound so that the magnet is attached to the leadframe by the same molding compound that encases the sensor die. The resulting molded sensor package includes the leadframe with sensor die, the magnet aligned with the sensor die and a single molding compound encasing the sensor die and attaching the magnet to the leadframe.

Figure 1E:
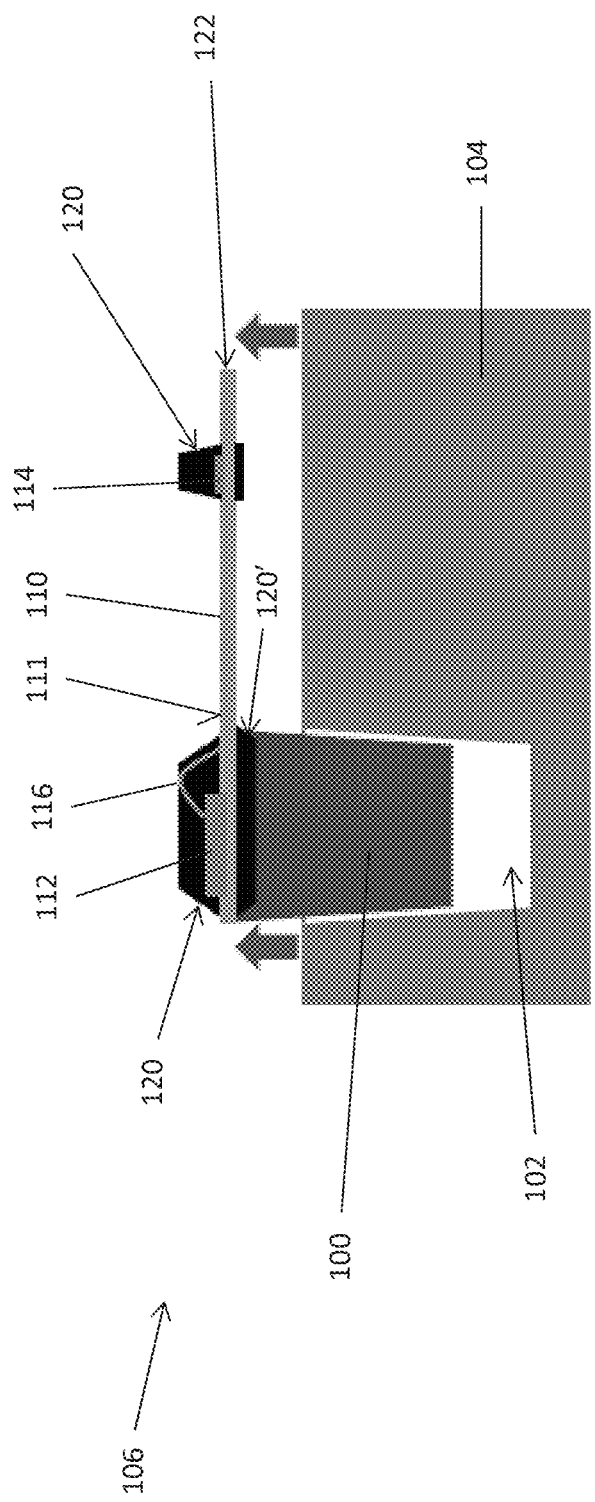

FIG. 1, which includes FIGS. 1A through 1E, illustrates an embodiment of a method of a single molding process for manufacturing a molded sensor package with a magnet.

In FIG. 1A, a magnet 100 is placed in a cavity 102 of a mold 104 of a molding tool 106 as indicated by the downward facing arrow. Any standard molding tool, mold and magnet can be used. The magnet 100 is selected based on the type of sensor employed and parameters associated with the circuit formed by the sensor and magnet. For example, the sensor can be a Hall sensor, cam shaft sensor or any other type of electronic sensor that uses a magnet. The magnet 100 can have a surface 101 with an indentation 108 that faces outward from the mold cavity 102.

In FIG. 1B, a leadframe 110 is placed in the mold 104 above the magnet 100 as indicated by the downward facing arrows. A leadframe is a stamped, etched or otherwise patterned metal frame, usually connected to bonding pads of a die by wire bonding, and provides external electrical connections for a packaged electrical device. The leadframe 110 has a sensor die 112 such as Hall sensor die, cam shaft sensor die, etc. attached to the leadframe 110. A capacitor or other type of component 114 can be connected to leads of the leadframe 110. Depending on the type of die, the sensor die 112 can be glued or soldered to one side 111 of the leadframe 110 e.g. to a so-called die paddle. For example, the sensor die 112 can be soldered to the leadframe 110 to provide an electrical connection to the backside of the die 112. If no electrical connection is needed at the die backside, the sensor die 112 can be glued to the leadframe 110 to provide a thermal connection to the backside of the die 112. In each case, one or more electrical connections 116 are provided from terminal(s) at the top side of the die 112 to leads of the leadframe 110. These electrical connections 116 can be wire bonds, wire ribbons, metal clips, etc. In each case, the leadframe 110 is loaded into the mold 104 so that the magnet 100 is aligned with the sensor die 112 in the molding tool 106. If the surface 101 of the magnet 100 that faces outward from the mold cavity 102 is provided with an indentation 108 as shown in FIGS. 1A and 1B, the leadframe 110 is loaded into the mold 104 so that the surface 101 of the magnet 100 with the indentation 108 faces the leadframe 110 and the indentation 108 provides a gap 118 between at least part of the magnet 100 and the leadframe 110.

In FIG. 1C, the mold 104 is closed and a molding compound 120 fills any unfilled gaps 118 between the magnet 100 and the leadframe 110 and between the components 112, 114 attached to the leadframe 110 and the mold 104. The molding compound 120 is then cured using any standard curing process. The same (cured) molding compound 120 that encases the sensor die 112 and other optional components 114 attached to the leadframe 110 also attaches the magnet 100 to the leadframe 110. If the surface 101 of the magnet 100 that faces outward from the mold cavity 102 is provided with an indentation 108 as shown in FIGS. 1A-1C, the magnet 100 is attached to the leadframe 110 after curing of the molding compound 120 by the part of the (cured) molding compound 120' that fills the gap 118 provided by the indentation 108 in the surface 101 of the magnet 100.

The single molding process illustrated in FIGS. 1A-1C can be implemented by any standard molding process such as transfer molding, injection molding, compression molding, etc. The molding compound 120 that encases the sensor die 112 and attaches the magnet 100 to the leadframe 110 can be any standard molding compound such as a high Tg or low Tg thermoplastic material. For example, the magnet 100 and the sensor die 112 can be molded with an aromatic molding compound such as a multi-aromatic, biphenyl, ortho cresol novolac, or polyamide molding compound having a glass transition temperature (Tg) below 180° C., applying lower thermal stress to the package. In another embodiment, the magnet 100 and the sensor die 120 are molded with a multi-functional molding compound such as a multifunctional epoxy resin-based compound having a glass transition temperature (Tg) above 180° C. In general, the type of molding compound depends on the package and application in which the package is to be deployed. In each case, a single molding compound 120 is used to encase the sensor die 112 and attach the magnet 100 to the leadframe 110.

In FIG. 1D, the mold 104 of the molding tool 106 is opened as indicated by the upward facing arrows.

In FIG. 1E, the molded sensor package 122 with magnet 100 is removed from the molding tool 106 as indicated by the upward facing arrows.

Several molded sensor packages can be manufactured in parallel via the single molding process. For example, the mold 104 and molding tool 106 shown in FIGS. 1A-1E can accommodate a plurality of magnets 100 and a plurality of leadframes 110 at the same time. The magnets 100 loaded into the molding tool 106 can be separated (singulated) in advance of being loaded into the molding tool 106, or can remain interconnected during the molding process.

FIG. 2, which includes FIGS. 2A through 2C, illustrates an embodiment of a method of a single molding process for manufacturing a batch of molded sensor packages where the magnets remain interconnected during the molding process.

In FIG. 2A, an array 200 of interconnected magnets 100 is placed in a mold 104 of the molding tool 106. The magnets 100 remain interconnected e.g. by connecting bars or magnet runners 202.

In FIG. 2B, the leadframes 110 each with a sensor die 112 are loaded into the molding tool 106 so that each leadframe 110 is aligned with one of the magnets 100 in the mold 104.

In FIG. 2C, the sensor dies 112 and the magnets 100 are then molded with the same molding compound 120 such as a thermoset material e.g. as previously described herein in connection with FIG. 1C. The molded packages 204 are removed from the molding tool 106 as indicated by the upward facing arrows. The interconnections between the magnets 100 are severed e.g. by laser or a cutting tool after the magnets 100 and the sensor dies 112 are molded with the same molding compound 120 and the molding compound 120 is cured.

Figure 3A:
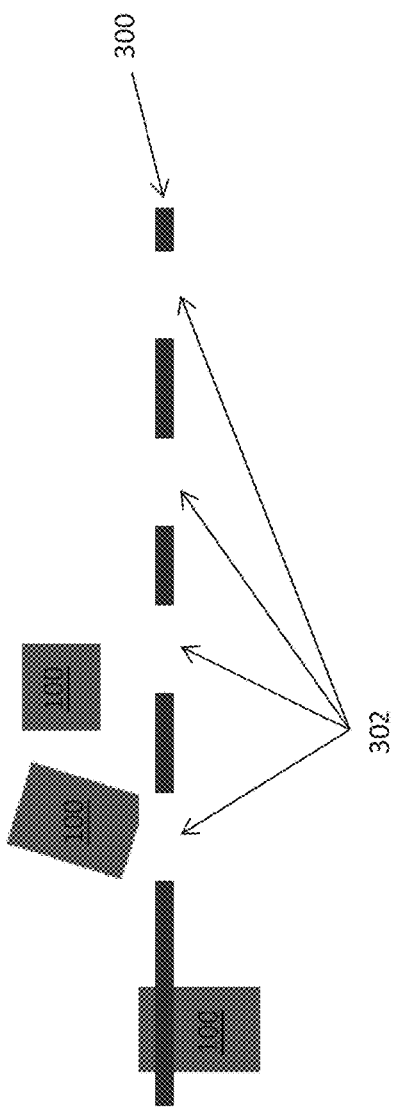
FIGS. 3A through 3D, illustrates an embodiment of a method of a single molding process for manufacturing a batch of molded sensor packages where the magnets are separated before the molding process.
Figure 3B:
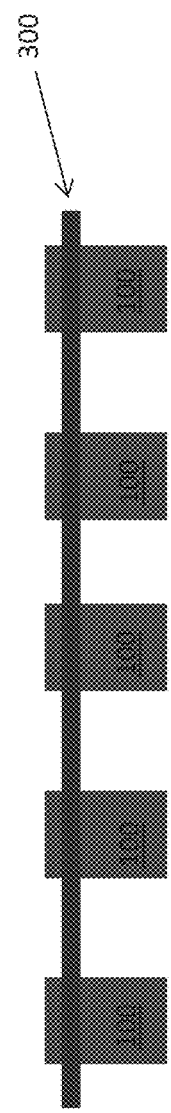
Figure 3C:
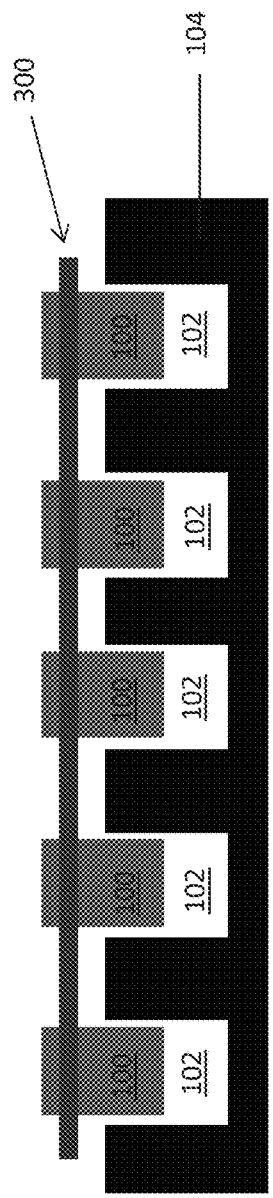

FIG. 3, which includes FIGS. 3A through 3C, illustrates an embodiment of a method of a single molding process for manufacturing a batch of molded sensor packages where the magnets are separated (singulated) before the molding process.

In FIG. 3A, pre-separated magnets 100 are placed into a placement jig 300 e.g. by single magnet treatment out of a bowl feeder. The placement jig 300 contains slots or cavities 302 for receiving the individual magnets 100.

In FIG. 3B, the placement jig 300 maintains the magnets 100 in proper alignment during transport to the molding tool 106.

In FIG. 3C, the pre-separated magnets 100 are loaded into the mold 104 of the molding tool 106 via the placement jig 300. The magnets 100 can be placed by an auto-mold system. The magnets 100 can be linked e.g. by magnet runners (out of view) in the molding tool 106.

Figure 3D:
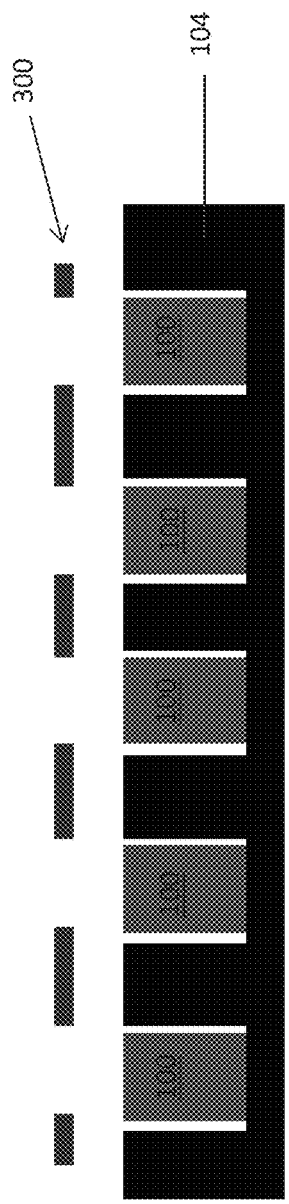

In FIG. 3D, the placement jig 300 is removed after magnet placement in the molding tool 106. Leadframes with sensor dies are then loaded into the molding tool 106 so that each leadframe is aligned with one of the magnets 100 in the mold 104, the sensor dies and the magnets 100 are molded with the same molding compound such as a thermoset molding compound, and the resulting molded packages are removed from the molding tool 106 e.g. as previously described herein in connection with FIGS. 1B-1E. The magnets 100 were pre-separated (singulated) prior to placement in the molding tool 106 according to this embodiment, and therefore no post-molding magnet separation is needed.

The surface 101 of the magnet 100 facing the corresponding leadframe 110 can be planar or non-planar. For example, in the embodiment of FIG. 1, the surface 101 of the magnet 100 that faces outward from the mold cavity 102 has an indentation 108. The magnet 100 is attached to the leadframe 110 by the part 120' of the (cured) molding compound 120 that fills the corresponding gap 118 provided by the indentation 108 between the surface 101 of the magnet 100 and the leadframe 100. By using a magnet 100 having an indentation 108 formed in the surface 101 of the magnet 100 that faces the leadframe 110, an interlocked connection is formed between the magnet 100 and the leadframe 110 via the part 120' of the molding compound 120 that fills the corresponding gap provided by the indentation 108. The indentation 108, if present, can have several forms to enable the interlocked connection between the magnet 100 and the leadframe 110.

FIG. 4, which includes FIGS. 4A through 4D, illustrates different embodiments of the indentation 108 provided in the surface 101 of the magnet 100 that faces outward from the mold cavity 102.

Figure 4B:
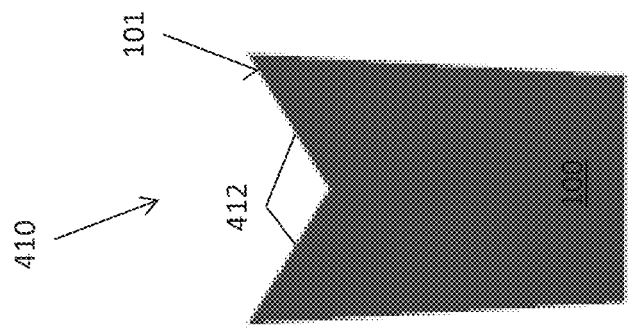
FIGS. 4A through 4D, illustrates cross-sectional views of different embodiments of a magnet included in a molded sensor package.
Figure 4A:
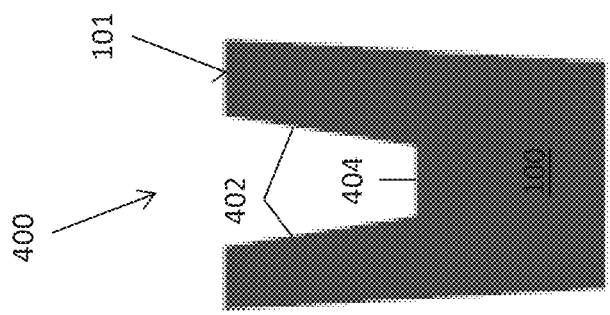

In FIG. 4A, the indentation 108 is a U-shaped notch 400. The U-shaped notch 400 has angled sidewalls 402 that extend from the top surface 101 of the magnet 100 into the body of magnet 100, and a bottom 404 that connects the sidewalls 402 at the bottom of the U-shaped notch 400.

In FIG. 4B, the indentation 108 is a V-shaped notch 410. The V-shaped notch 410 has angled sidewalls 412 that extend from the top surface 101 of the magnet 100 into the body of magnet 100 and join at the bottom of the V-shaped notch 410.

Figure 4D:
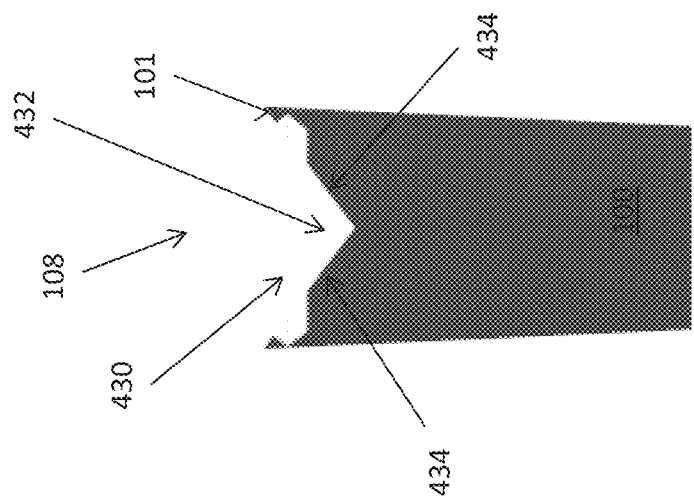
Figure 4C:
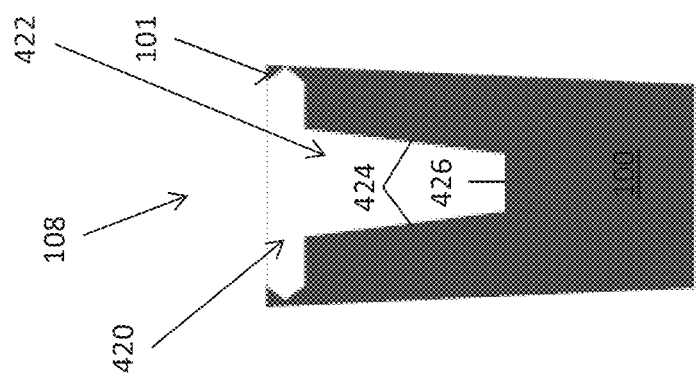

In FIG. 4C, the indentation 108 has a wider upper part 420 which would be placed adjacent a leadframe and a narrower lower part 422 in open communication with the wider upper part 420. The narrower lower part 422 is spaced apart from the leadframe by the wider upper part 420. The narrower lower part 422 of the indentation 108 is a U-shaped notch according to this embodiment. The U-shaped notch has angled sidewalls 424 and a bottom 426 that connects the sidewalls 424 at the bottom of the U-shaped notch.

In FIG. 4D, the indentation 108 has a wider upper part 430 and a narrower lower part 432 in open communication with the wider upper part 430 similar to the embodiment of FIG. 4C. Different than the embodiment of FIG. 4C, the narrower lower part 432 of the indentation is a V-shaped notch. The V-shaped notch has angled sidewalls 434 that join at the bottom of the V-shaped notch.

Spatially relative terms such as "under", "below", "lower", "over", "upper" and the like, are used for ease of description to explain the positioning of one element relative to a second element. These terms are intended to encompass different orientations of the package in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open-ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A method of manufacturing a molded sensor package, the method comprising:

loading a magnet and a leadframe having a sensor die attached to the leadframe into a molding tool so that the magnet is aligned with the sensor die in the molding tool;

molding the magnet and the sensor die with the same molding compound while loaded in the molding tool; and curing the molding compound so that the magnet is attached to the leadframe by the same molding compound that encases the sensor die, wherein loading the magnet and the leadframe into the molding tool comprises:

placing the magnet in a cavity of a mold of the molding tool, the magnet having a surface with an indentation that faces outward from the cavity; and placing the leadframe in the mold above the magnet so that the surface of the magnet with the indentation faces the leadframe and the indentation provides a gap between at least part of the magnet and the leadframe.

2. The method of claim 1, wherein the molding compound fills the gap between the magnet and the leadframe during the molding so that the magnet is attached to the leadframe after the curing of the molding compound by the part of the molding compound that fills the gap.

3. The method of claim 1, wherein molding the magnet and the sensor die with the same molding compound while loaded in the molding tool comprises:

molding the magnet and the sensor die with an aromatic molding compound having a glass transition temperature below 180° C.

4. The method of claim 1, wherein molding the magnet and the sensor die with the same molding compound while loaded in the molding tool comprises:

molding the magnet and the sensor die with a multi-functional molding compound having a glass transition temperature above 180° C.

5. A method of manufacturing molded sensor packages, the method comprising:

loading a plurality of magnets and a plurality of leadframes each having a sensor die attached to the leadframe into a molding tool so that each magnet is aligned with one of the sensor dies in the molding tool;

molding the magnets and the sensor dies with the same molding compound while loaded in the molding tool; and curing the molding compound so that each magnet is attached to one of the leadframes by the same molding compound that encases the sensor die of that leadframe, wherein loading the plurality of magnets and the plurality of leadframes into the molding tool comprises:

placing each magnet in a cavity of a mold of the molding tool, each magnet having a surface with an indentation that faces outward from the cavity; and placing each leadframe in the mold above one of the magnets so that the surface of the magnet with the indentation faces that leadframe and the indentation provides a gap between at least part of the magnet and the leadframe.

6. The method of claim 5, wherein the molding compound fills the gap between each magnet and leadframe during the molding so that each magnet is attached to one of the leadframes after the curing of the molding compound by the part of the molding compound that fills the gap.

7. The method of claim 5, wherein molding the magnets and the sensor dies with the same molding compound while loaded in the molding tool comprises:

molding the magnets and the sensor dies with an aromatic molding compound having a glass transition temperature below 180° C.

8. The method of claim 5, wherein molding the magnets and the sensor dies with the same molding compound while loaded in the molding tool comprises:
   molding the magnets and the sensor dies with a multi-functional molding compound having a glass transition temperature above 180° C.

9. The method of claim 5, further comprising:
   placing an array of interconnected magnets into the mold of the molding tool; and
   aligning each leadframe with one of the magnets in the mold.

10. The method of claim 9, further comprising:
    severing the interconnections between the magnets after the magnets and the sensor dies are molded with the same molding compound and the molding compound is cured.

11. The method of claim 5, further comprising:
    placing pre-separated magnets into a jig;
    loading the pre-separated magnets into the mold of the molding tool via the jig; and
    aligning each leadframe with one of the pre-separated magnets in the mold.

* * * * *